(12) United States Patent
Kim

(10) Patent No.: US 9,892,764 B2
(45) Date of Patent: Feb. 13, 2018

(54) MULTIPLE PATH CONFIGURATION FOR POWER SUPPLY POWER OF SEMICONDUCTOR CHIP MODULES

(71) Applicant: Young-Il Kim, Yongin-si (KR)

(72) Inventor: Young-Il Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/190,421

(22) Filed: Jun. 23, 2016

(65) Prior Publication Data

US 2017/0084312 A1    Mar. 23, 2017

(30) Foreign Application Priority Data

Sep. 18, 2015 (KR) .................. 10-2015-0132520

(51) Int. Cl.
| | | |
|---|---|---|
| *G11C 5/14* | (2006.01) | |
| *G11C 11/419* | (2006.01) | |
| *H01L 25/18* | (2006.01) | |
| *H01L 25/065* | (2006.01) | |
| *G05F 1/10* | (2006.01) | |

(52) U.S. Cl.
CPC .............. *G11C 5/14* (2013.01); *G11C 5/143* (2013.01); *G11C 5/147* (2013.01); *G11C 11/419* (2013.01); *G05F 1/10* (2013.01); *H01L 25/0657* (2013.01); *H01L 25/18* (2013.01)

(58) Field of Classification Search
CPC ....... G11C 5/14; G11C 5/147; G11C 11/4074; G05F 1/10; G06F 1/26; G06F 1/28; G06F 2217/78; G01R 19/16552; G01R 31/31721; H01L 2924/14; Y02B 60/1282; Y02B 60/1278

See application file for complete search history.

(56) References Cited

U.S. PATENT DOCUMENTS

| | | |
|---|---|---|
| 5,835,434 A | 11/1998 | Hirayama |
| 7,035,131 B2 | 4/2006 | Huang et al. |
| 7,446,549 B2 | 11/2008 | Tomita et al. |
| 8,482,320 B2 | 7/2013 | Otake |
| 2008/0082873 A1* | 4/2008 | Russell .................. G11C 5/147 714/721 |
| 2011/0006792 A1 | 1/2011 | Otsuga et al. |
| 2012/0086424 A1 | 4/2012 | Uemura |
| 2012/0294105 A1* | 11/2012 | Seki ........................ G11O 5/147 365/226 |
| 2013/0069623 A1 | 3/2013 | Fort |
| 2013/0193992 A1 | 8/2013 | Kato |

(Continued)

*Primary Examiner* — Richard Elms
*Assistant Examiner* — Ajay Ojha
(74) *Attorney, Agent, or Firm* — Myers Bigel, P.A.

(57) ABSTRACT

A semiconductor chip includes a first circuit block configured to receive a first power supply voltage through a first power supply terminal of the semiconductor chip, a second circuit block configured to receive a second power supply voltage through a second power supply terminal of the semiconductor chip, and an alternative supply unit that is connected between the first power supply terminal and the first circuit block and receives the first power supply voltage through the first power supply terminal. The alternative supply circuit is configured to apply an alternative power supply voltage generated using the second power supply voltage to the first circuit block in response to a supply of the first power supply voltage being stopped.

17 Claims, 16 Drawing Sheets

(56) References Cited

U.S. PATENT DOCUMENTS

| | | | |
|---|---|---|---|
| 2013/0208555 A1* | 8/2013 | McMahon | G11C 11/413 365/226 |
| 2014/0313819 A1* | 10/2014 | Choi | G11C 5/14 365/156 |
| 2014/0334051 A1 | 11/2014 | Yagyu et al. | |
| 2015/0036446 A1* | 2/2015 | Kenkare | H02J 1/00 365/226 |
| 2015/0146328 A1 | 5/2015 | Mikami et al. | |

* cited by examiner

MULTIPLE PATH CONFIGURATION FOR POWER SUPPLY POWER OF SEMICONDUCTOR CHIP MODULES

CROSS-REFERENCE TO RELATED APPLICATION

This application claims priority under 35 U.S.C. § 119 to Korean Patent Application No. 10-2015-0132520, filed on Sep. 18, 2015, in the Korean Intellectual Property Office, the entire contents of which are hereby incorporated herein by reference.

BACKGROUND

1. Technical Field

The inventive concepts relate to semiconductor chips, methods of operating the semiconductor chips and semiconductor packages including the semiconductor chips.

2. Description of the Related Art

Memory semiconductors and non-memory semiconductors may be embodied using semiconductor materials, such as silicon (Si), germanium (Ge), gallium arsenide (GaAs), indium phosphide (InP), etc. Semiconductor devices, such as transistors or memory devices, may be formed on a semiconductor substrate to constitute a semiconductor chip. One or more semiconductor chips may be packaged to constitute a semiconductor package. One or more semiconductor chips may be provided on a PCB (printed circuit board) to constitute an electronic device, such as a memory system. The memory system may include a memory semiconductor, such as a nonvolatile memory or a volatile memory and a non-memory semiconductor, such as a memory controller.

A memory controller may be configured to control a plurality of memories. To select the memories respectively, the memory controller may generate chip select signals.

SUMMARY

Some embodiments of the inventive concepts may provide a semiconductor chip which includes a first circuit block configured to receive a first power supply voltage through a first power supply terminal of the semiconductor chip, a second circuit block configured to receive a second power supply voltage through a second power supply terminal of the semiconductor chip, and an alternative supply circuit that is connected to the first power supply terminal and to the first circuit block and configured to receive the first power supply voltage through the first power supply terminal. The alternative supply circuit is configured to apply an alternative power supply voltage generated using the second power supply voltage to the first circuit block in response to the first power supply voltage being stopped.

Some embodiments of the inventive concepts may provide a semiconductor package which includes a first semiconductor chip and a second semiconductor chip disposed together with the first semiconductor chip. The first semiconductor chip comprises a first circuit block configured to receive a first power supply voltage through a first power supply terminal of the first semiconductor chip, a second circuit block configured to receive a second power supply voltage through a second power supply terminal of the first semiconductor chip, and a first alternative supply circuit that is connected between the first power supply terminal and the first circuit block and that is configured to receive the first power supply voltage through the first power supply terminal. The second semiconductor chip comprises a third circuit block configured to receive the first power supply voltage through a third power supply terminal of the second semiconductor chip, a fourth circuit block configured to receive the second power supply voltage through a fourth power supply terminal of the second semiconductor chip and a second alternative supply circuit that is connected between the third power supply terminal and the third circuit block, and configured to receive the first power supply voltage through the third power supply terminal. The first alternative supply circuit, is configured to apply an alternative power supply voltage generated using the second power supply voltage to the first circuit block lithe first power supply voltage is stopped and the second alternative supply circuit is configured to apply the alternative power supply voltage generated using the second power supply voltage to the third circuit block if the first power supply voltage is stopped.

Some embodiments of the inventive concepts may provide a semiconductor chip which includes a first input configured to receive a first voltage supply, a second input configured to receive a second voltage supply, a circuit block configured to receive the first voltage supply, and a current supply unit. The current supply unit may include a detector configured to monitor the first voltage supply and determine that the first voltage supply is stopped, an alternative supply circuit configured to provide the second voltage supply to the circuit block responsive to a determination by the detector that the first voltage supply is stopped, and a current detect circuit connected to the alternative supply circuit. The current detect circuit may be configured to measure an amount of current consumed by the circuit block when connected to the second voltage supply. The current detect circuit may be configured to transmit the measured amount of current consumed by the circuit block as an output of the current supply unit.

BRIEF DESCRIPTION OF THE DRAWINGS

The present disclosure will be described below in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concepts to those skilled in the art. Like numbers refer to like elements throughout.

DETAILED DESCRIPTION

Figure 1:
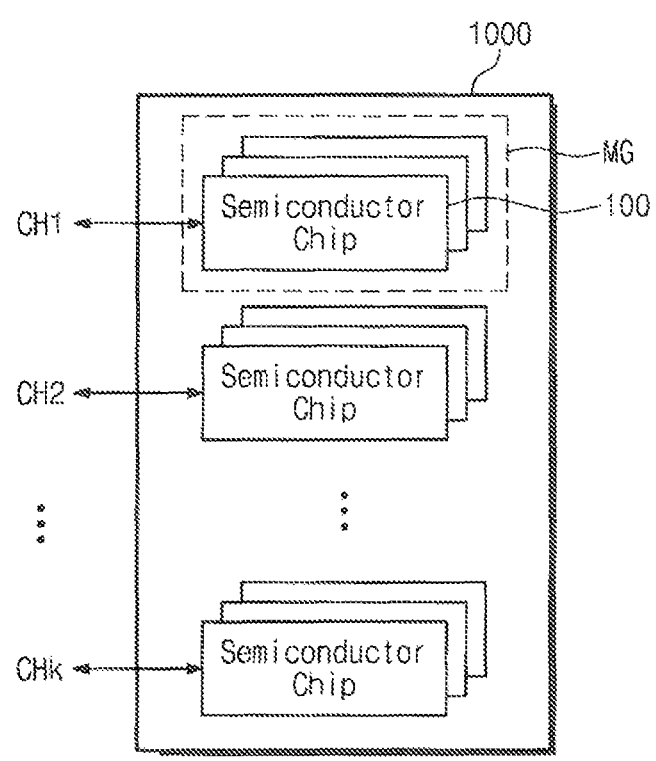
FIG. 1 illustrates a semiconductor package in accordance with some embodiments of the inventive concepts.

Example embodiments will be described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the inventive concepts may be described with reference to cross-sectional illustrations, which are schematic illustrations of idealized embodiments of the present discloser. As such, variations from the shapes of the illustrations, as a result, for example, of manufacturing techniques and/or tolerances, are to be expected. Thus, embodiments of the present disclosure should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present disclosure.

FIG. 1 illustrates a semiconductor package 1000 in accordance with some embodiments of the inventive concepts. The semiconductor package 1000 may include a plurality of semiconductor chips 100. The semiconductor chips 100 may form a plurality of memory groups MG. The memory groups MG may be connected to a test device or a controller (not illustrated) through a plurality of channels CH1~CHk. Each memory group may include at least one semiconductor chip 100.

The semiconductor chip 100 may include a current supply unit. When there is an interruption in the supply of a part of a power supply voltage that is supplied from outside the semiconductor chip 100, the current supply unit can supply an alternative current. The current supply unit can sense the amount of current consumed in the semiconductor chip 100. The current supply unit will be described in further detail with reference to FIGS. 2 through 5.

Figure 2:
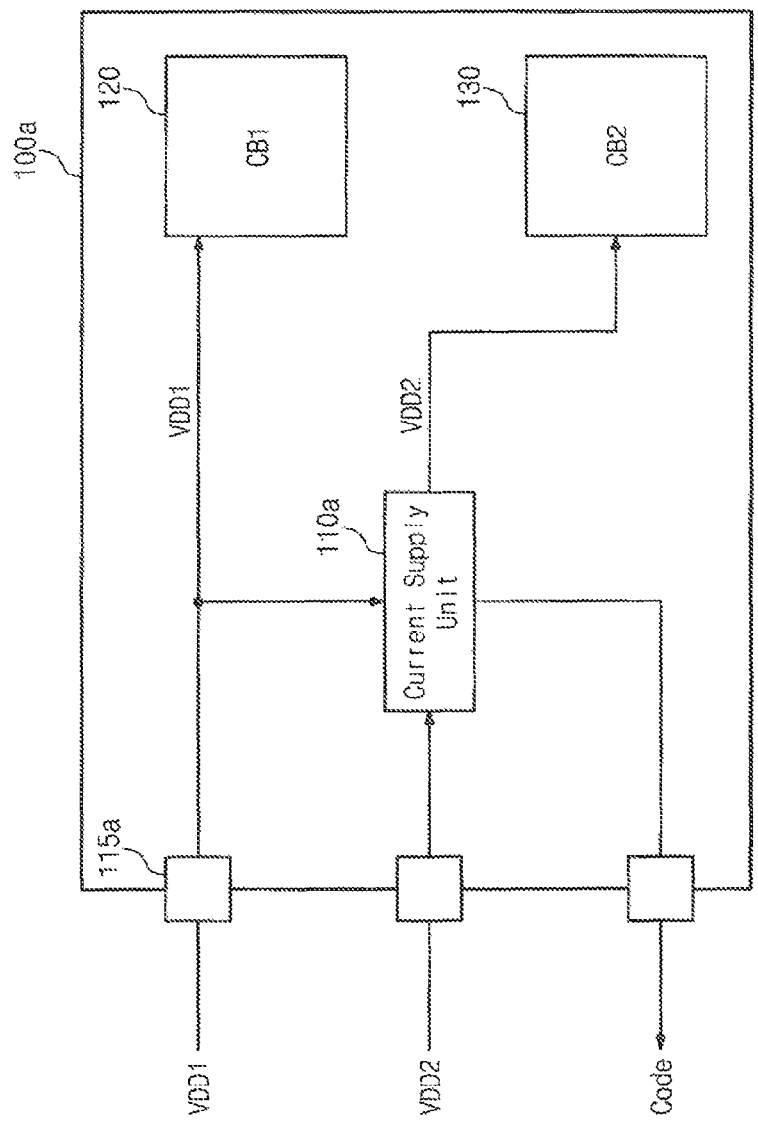
FIG. 2 illustrates a semiconductor chip connected to a plurality of power supply voltages in accordance with some embodiments of the inventive concepts.

FIG. 2 illustrates a semiconductor chip 100a connected to a plurality of power supply voltages in accordance with some embodiments of the inventive concepts. Referring to FIG. 2, the semiconductor chip 100a may include a current supply unit 110a, and first and second circuit blocks CB1 120 and CB2 130. A plurality of pads 115a may be provided on a surface of the semiconductor chip 100a. First and second power supply voltages VDD1 and VDD2 may be applied through the pads 115a.

The first, power supply voltage VDD1 may be a power supply for operating the first circuit block 120. The first power supply voltage VDD1 and the second power supply voltage VDD2 may be voltages generated by an external voltage generator (not illustrated). In some embodiments, the first power supply voltage VDD1 may have the same amplitude as the second power supply voltage VDD2. In other embodiments, the first power supply voltage VDD1 may have different amplitude from the second power supply voltage VDD2. For example, in some embodiments the first power supply voltage VDD1 may be greater than the second power supply voltage VDD2. In other embodiments, the first power supply voltage VDD1 may be smaller than the second power supply voltage VDD2.

The current supply unit 110a may receive the first power supply voltage VDD1 and the second power supply voltage VDD2. When the semiconductor chip 100a operates normally, the current supply unit 110a may apply the second power supply voltage VDD2 to the second circuit block 130.

If a supply of the second power supply voltage VDD2 from the outside is stopped, an operation of the semiconductor chip 100a may be stopped. Thus, to maintain normal operation of the semiconductor chip 100a, the current supply unit 110a may alternatively supply the first power supply voltage VDD1 to the second circuit block 130 instead of the second power supply voltage VDD2. Thus, a current supply unit 110a in accordance with some embodiments of the inventive concepts may not include an additional supplemental power supply device and may supply an alternative voltage from an existing power supply source.

If the first power supply voltage VDD1 is a voltage greater than the second power supply voltage VDD2, the current supply unit 110a may decrease the first power supply voltage VDD1 and may supply the decreased first power supply voltage VDD1 to the second circuit block 130. If the first power supply voltage VDD1 is a voltage smaller than the second power supply voltage VDD2, the current supply unit 110a may boost the first power supply voltage VDD1 and may supply the boosted first power supply voltage VDD1 to the second circuit block 130. The current supply unit 110a may measure the amount of current consumed in the second circuit block 130 and may output the measured current amount from the semiconductor chip 100a as data in the form of a code. In some embodiments, the code may be made available via one of the pads 115a.

Though FIG. 2 illustrates two power supply voltages VDD1 and VDD2, the number of power supply voltages according to embodiments of the inventive concepts are not limited thereto. For convenience of description, it is assumed that two power supply voltages VDD1 and VDD2 are applied. Similarly, although FIG. 2 illustrates two circuit blocks 120 and 130, the number of circuit blocks according to embodiments of the inventive concepts are not limited thereto. For convenience of description, it is assumed that two circuit blocks 120 and 130 are included.

Figure 3:
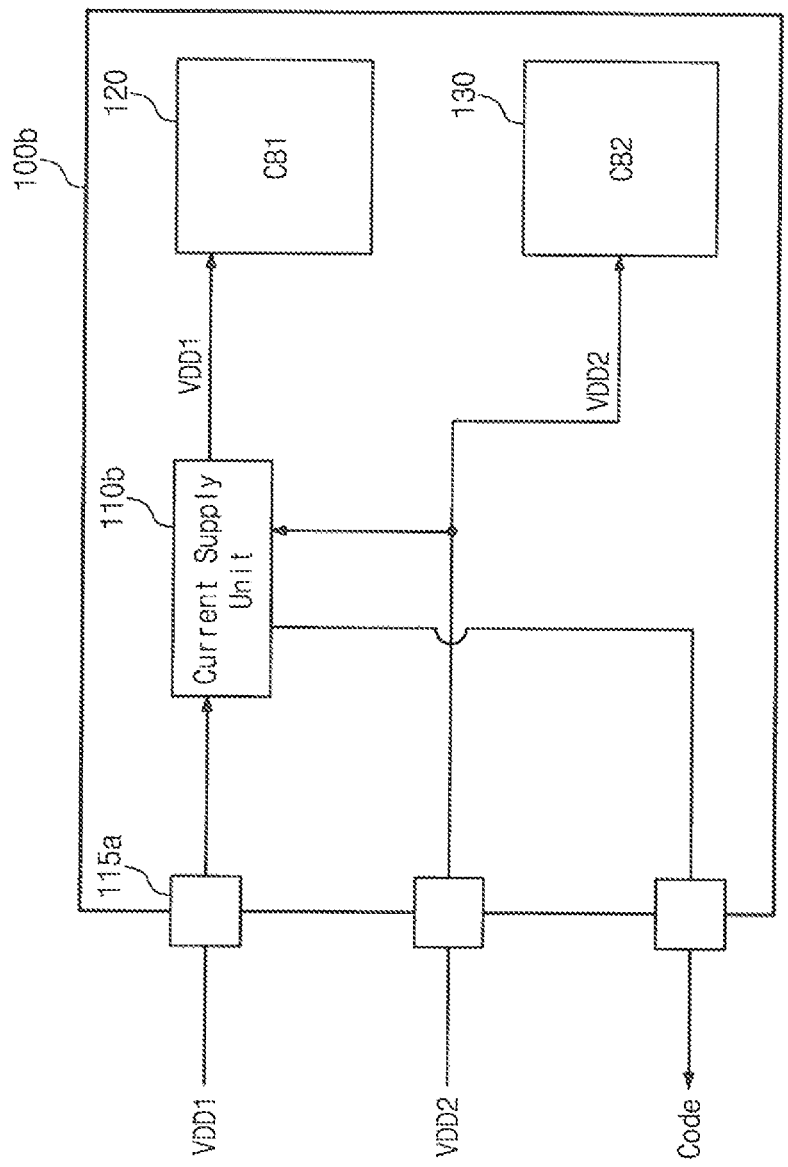
FIG. 3 illustrates a structure of a semiconductor chip in accordance with some embodiments of the inventive concepts.

FIG. 3 illustrates a structure of a semiconductor chip 100b in accordance with some embodiments of the inventive concepts. Referring to FIGS. 2 and 3, the semiconductor chip 100b may include a current supply unit 110b, and first and second circuit blocks 120 and 130.

A first power supply voltage VDD1 may be a power supply for operating the first circuit block 120. A second power supply voltage VDD2 may be a power supply for operating the second circuit block 130. In some embodiments, the first power supply voltage VDD1 may have the same amplitude as the second power supply voltage VDD2. In other embodiments, the first power supply voltage VDD1 may have a different amplitude from the second power supply voltage VDD2. For example, in some embodiments the first power supply voltage VDD1 may be smaller than the second power supply voltage VDD2. In other embodiments, the first power supply voltage VDD1 may be greater than the second power supply voltage VDD2.

When the semiconductor chip 100b operates normally, the current supply unit 110b may apply the first power supply voltage VDD1 to the first circuit block 120. If a supply of the first power supply voltage VDD1 is stopped, the current supply unit 110b may supply the second power supply voltage VDD2 to the first circuit block 120 instead of the first power supply voltage VDD1. If the first power supply voltage VDD1 is a voltage smaller than the second power supply voltage VDD2, the current supply unit 110b may decrease the second power supply voltage VDD2 and may supply the decreased second power supply voltage VDD2 to the first circuit block 120. If the first power supply voltage VDD1 is a voltage greater than the second power supply voltage VDD2, the current supply unit 110b may boost the second power supply voltage VDD2 and may supply the boosted second power supply voltage VDD2 to the first circuit block 120.

Figure 4:
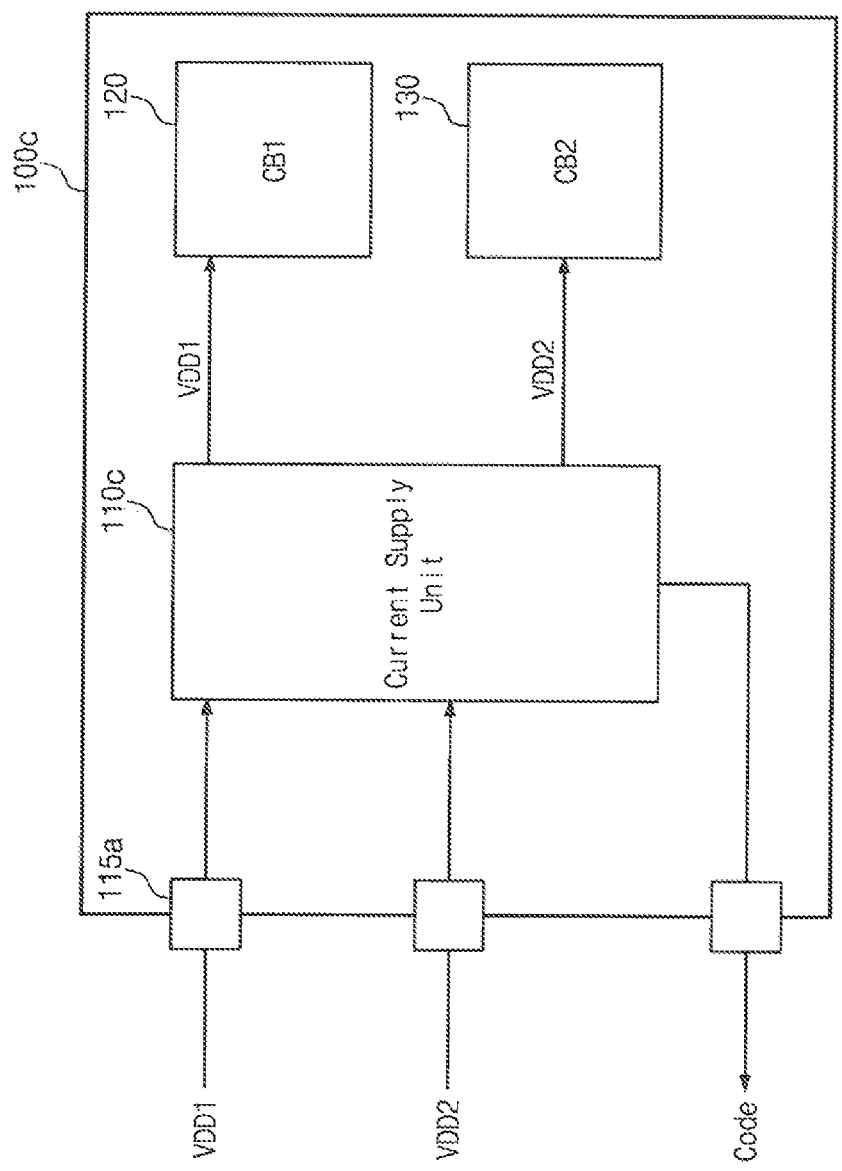
FIG. 4 illustrates a structure of a semiconductor chip capable of supplying an alternative current to a plurality of circuit blocks in accordance with some embodiments of the inventive concepts.

FIG. 4 illustrates a structure of a semiconductor chip 100c capable of supplying an alternative current to a plurality of circuit blocks in accordance with some embodiments of the inventive concepts. Referring to FIG. 4, the semiconductor chip 100c may include a current supply unit 110c, a first circuit block 120 and a second circuit block 130.

When the semiconductor chip 100c operates normally, the current supply unit 110c may apply a first power supply voltage VDD1 and a second power supply voltage VDD2 to the first circuit block 120 and the second circuit block 130 respectively. The first power supply voltage VDD1 and the second power supply voltage VDD2 may be the same voltage or may be a voltage within an allowable range. For example, the voltage of VDD2 may be within 25% of the voltage of VDD1.

If a supply of the first power supply voltage VDD1 is stopped, the current supply unit 110c may supply the second power supply voltage VDD2 to the first circuit block 120 instead of the first power supply voltage VDD1. In some embodiments, if a supply of the second power supply voltage VDD2 is stopped, the current supply unit 110c may supply the first power supply voltage VDD1 to the second circuit block 130 instead of the second power supply voltage VDD2.

Figure 5:
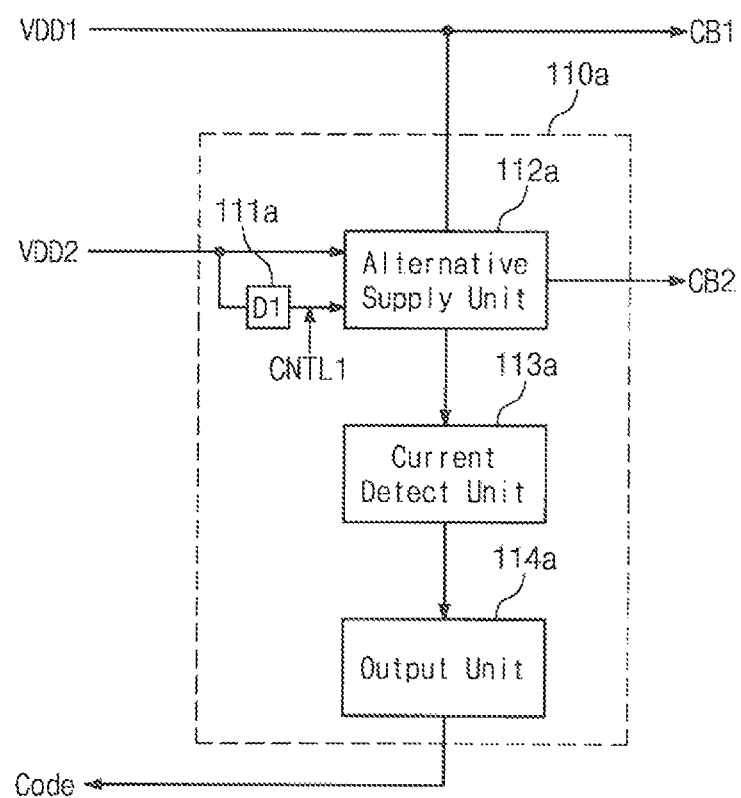
FIG. 5 illustrates a current supply unit in detail in accordance with some embodiments of the inventive concepts.

FIG. 5 illustrates a current supply unit 110a in detail in accordance with some embodiments of the inventive concepts. Referring to FIG. 5, the current supply unit 110a may include a detector D1 111a, an alternative supply unit 112a, a current detect unit 113a and an output unit 114a. Each of the detector 111a, the alternative supply unit 112a, the current detect unit 113a and the output unit 114a may include at least one digital and/or analog circuit to perform an operation to be described herein.

Referring to FIGS. 2 and 5, the detector 111a may detect the second power supply voltage VDD2. If the detector 111a detects that a supply of the second power supply voltage VDD2 is stopped, the detector 111a may output a first control signal CNTL1 for activating the alternative supply unit 112a.

As illustrated in FIG. 5, the first control signal CNTL1 may be generated by the detector 111a to activate the alternative supply unit 112a. In some embodiments, an additional signal may be provided to the alternative supply unit 112a to activate the alternative supply unit 112a instead of or in addition to, the first control signal CNTL1. In some embodiments, the additional signal and/or the first control signal CNTL1 may be supplied to the alternative supply unit 112a from a source external to the semiconductor chip 100 instead of from the detector 111a.

The alternative supply unit 112a may be supplied with the first power supply voltage VDD1 and the second power supply voltage VDD2. When the semiconductor chip 110a operates normally, the alternative supply unit 112a may apply the second power supply voltage VDD2 to the second circuit block 130 (FIG. 2). However, if a supply of the second power supply voltage VDD2 is stopped, the alternative supply unit 112a may be activated by the first control signal CNTL1 of the detector 111a. The alternative supply unit 112a may supply the first power supply voltage VDD1 to the second circuit block 130 instead of the second power supply voltage VDD2. Embodiments of the alternative supply unit 112a will be further described with respect to FIG. 6.

The current detect unit 113a may measure the amount of current consumed in the second circuit block 130 of the semiconductor chip 100 (FIG. 2). The current detect unit 113a may detect the amount of current consumed in the second circuit block 130. The current detect unit 113a may output data about the amount of current consumed in the second circuit block 130 to the output unit 114a. The output unit 114a can transmit the data received from the current detect unit 113a in the form of a code. In some embodiments, the output unit 114a can transmit the code as output from the semiconductor chip 100.

The current supply unit 110b of FIG. 3 may include a similar structure to the embodiment illustrated in FIG. 5. However, a detector of the current supply unit 110b may detect whether the first power supply voltage VDD1 is applied. If a supply of the first power supply voltage VDD1 is stopped, the detector of the current supply unit 110b may apply a control signal that activates an alternative supply unit of the current supply unit 110b. The alternative supply unit of the current supply unit 110b may supply the second power supply voltage VDD2 to the first circuit block 120 instead of the first power supply voltage VDD1.

Figure 6:
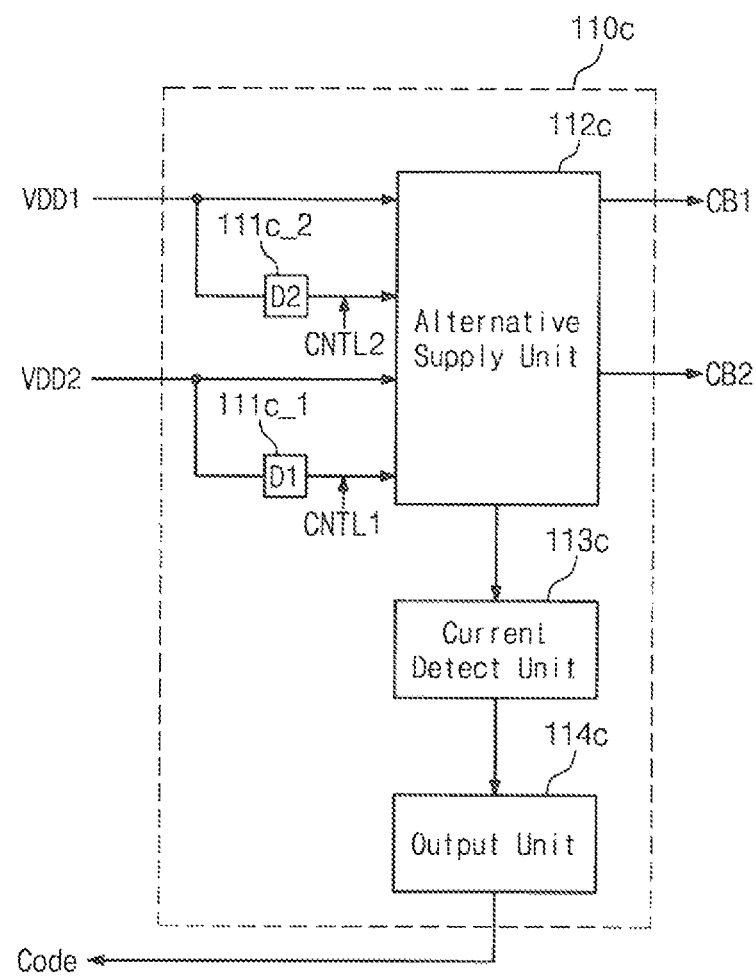
FIG. 6 illustrates a current supply unit included in the semiconductor chip of FIG. 4 in detail in accordance with some embodiments of the inventive concepts.

FIG. 6 illustrates a current supply unit 110c included in the semiconductor chip 100c of FIG. 4 in detail in accordance with some embodiments of the inventive concepts. The current supply unit 110c may include a first detector D1 111c_1, a second detector D2 111c_2, an alternative supply unit 112c, a current detect unit 113c and an output unit 114c.

Referring to FIGS. 4 and 6, the first detector 111c_1 may detect whether the second power supply voltage VDD2 is applied. The second detector 111c_2 may detect whether the first power supply voltage VDD1 is applied. If a supply of the second power supply voltage VDD2 is stopped, the first detector 111c_1 may output a first control signal CNTL1 to activate the alternative supply unit 112c. If the alternative supply unit 112c receives the first control signal CNTL1, the alternative supply unit 112c may apply the first power supply voltage VDD1 to the second circuit block 130 instead of the second power supply voltage VDD2. During this operation, the first power supply voltage VDD1 may continue to be applied to the first circuit block 120.

In some embodiments, if a supply of the first power supply voltage VDD1 is stopped, the second detector 111c_2 may output a second control signal CNTL2 to activate the alternative supply unit 112c. If the alternative supply unit 112c receives the second control signal CNTL2, the alternative supply unit 112c may apply the second power supply voltage VDD2 to the first circuit block 120 instead of the first power supply voltage VDD1. During this operation, the second power supply voltage VDD2 may continue to be applied to the second circuit block 130.

Since operation methods of the current detect unit 113c and the output unit 114c are the same as those of the current detect unit 113a and the output unit 114a illustrated in FIG. 5, a detailed description thereof is omitted.

Figure 7:
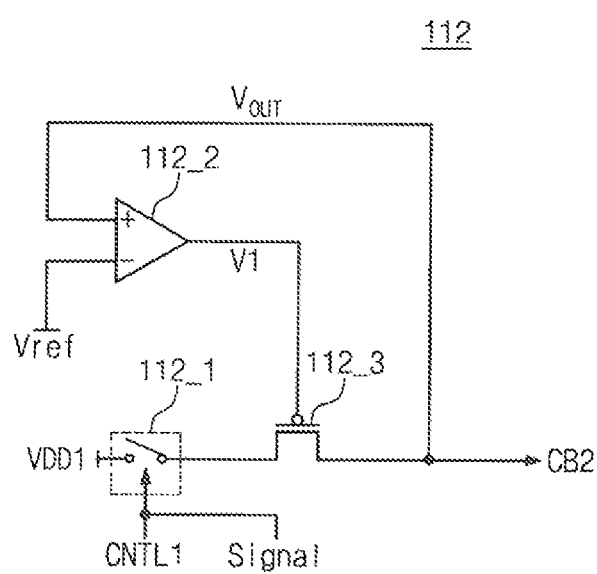
FIG. 7 illustrates an embodiment of an alternative supply unit in accordance with some embodiments of the inventive concepts.

FIG. 7 illustrates an embodiment of an alternative supply unit 112 in accordance with some embodiments of the inventive concepts. Referring to FIGS. 5 through 7, the alternative supply unit 112 may include a switch unit 112_1, a comparator 112_2 and a transistor 112_3.

The switch unit 112_1 may be controlled by the first control signal CNTL1. The first control signal CNTL1 is a signal for activating the alternative supply unit 112. For example, if a supply of the second power supply voltage VDD2 from the outside is stopped, the switch unit 112_1 may be turned on by the first control signal CNTL1.

In some embodiments, the switch unit 112_1 may be controlled by an additional signal provided to the alternative supply unit 112 to activate the alternative supply unit 112 instead of, or in addition to, the first control signal CNTL1. In some embodiments, the signal may be supplied to the alternative supply unit 112 from a source external to the semiconductor chip 100. In some embodiments, the signal may be a mode register set (MRS) signal, as discussed in more detail below.

The first power supply voltage VDD1 may be applied to an input of the switch unit 112_1. If the switch unit 112_1 is turned on, the first power supply voltage VDD1 may be applied to the transistor 112_3 connected to the switch unit 112_1.

The comparator 112_2 may form a feedback loop together with the transistor 112_3. In some embodiments, the feedback loop may be a DC positive feedback loop. The comparator 112_2 may include two input terminals. The comparator 112_2 may receive a reference voltage Vref through one input terminal. The comparator 112_2 may receive an output voltage Vout through the other input terminal. An output terminal of the comparator 112_2 may be connected to a gate terminal of the transistor 112_3. In some embodiments, the reference voltage Vref may have the same level as the second power supply voltage VDD2. The comparator 112_2 may maintain a control voltage V1 as the reference voltage Vref. However, the reference voltage Vref is not limited thereto and may be controlled as necessary.

The transistor 112_3 may be a PMOS transistor. The first power supply voltage VDD1 may be applied to a terminal of the transistor 112_3 that functions as a current switch capable of controlling a voltage, and the control voltage V1 may be applied to the gate terminal of the transistor 112_3. The other terminal of the transistor 112_3 may be connected to an output terminal and may provide the output voltage Vout. If the output voltage Vout is changed by a load variation, the output voltage Vout of the transistor 112_3 may be controlled to a target level by adjusting a level of the control voltage V1. The target level may be a level of the second power supply voltage VDD2.

In some embodiments, an alternative supply unit of the current supply unit 110b included in FIG. 3 may include a similar structure to that illustrated in FIG. 7. The second power supply voltage VDD2 may be supplied to one terminal of the switch unit 112_1. If a supply of the first power supply voltage VDD1 is stopped, the switch unit 112_1 may be turned on by the second control signal CNTL2. If the switch unit 112_1 is turned on, the second power supply voltage VDD2 may be applied to one terminal of the transistor 112_3.

Figure 8:
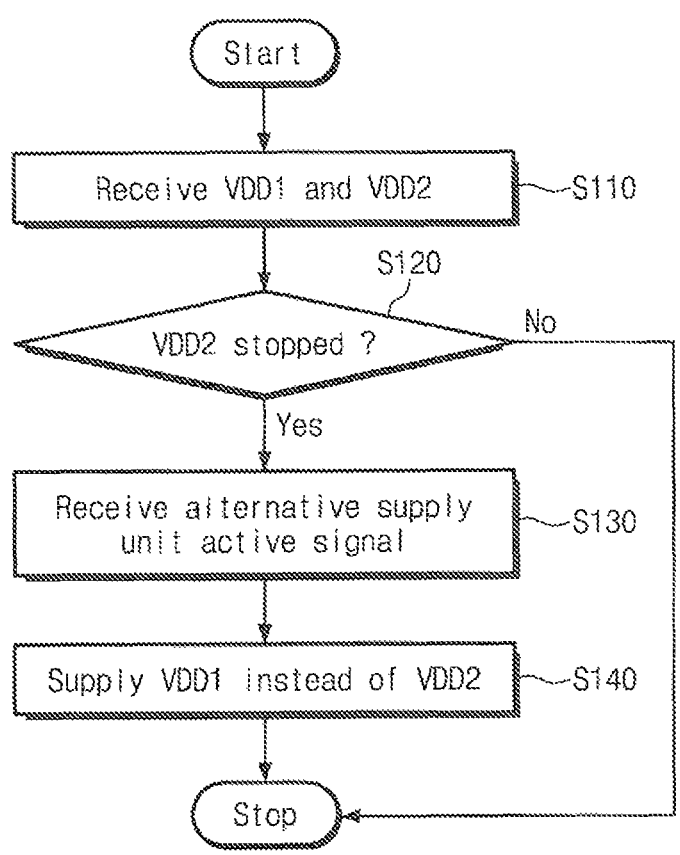
FIG. 8 is a flowchart illustrating operation of an alternative supply method in accordance with some embodiments of the inventive concepts.

FIG. 8 is a flowchart illustrating operation of an alternative supply method in accordance with some embodiments of the inventive concepts. Referring to FIGS. 1 through 8, the semiconductor chip 100 may receive the first power supply voltage VDD1 and the second power supply voltage VDD2 (S110). The first power supply voltage VDD1 and the second power supply voltage VDD2 may be voltages to drive the semiconductor chip 100. The first power supply voltage VDD1 may be supplied to the first circuit block 120 and the second power supply voltage VDD2 may be supplied to the second circuit block 130. It may be determined whether a supply of the second power supply voltage VDD2 is stopped (S120).

If a supply of the second power supply voltage VDD2 is stopped, the alternative supply unit 112 may receive the first control signal CNTL1 that activates the alternative supply unit 112 from the detector 111a (S130). Referring to FIG. 7, the switch unit 112_1 may be turned on by the first control signal CNTL1 and the first power supply voltage VDD1 may be applied to the alternative supply unit 112. The alternative supply unit 112 may apply the first power supply voltage VDD1 to the second circuit block 130 instead of the second power supply voltage VDD2 (S140).

Figure 9:
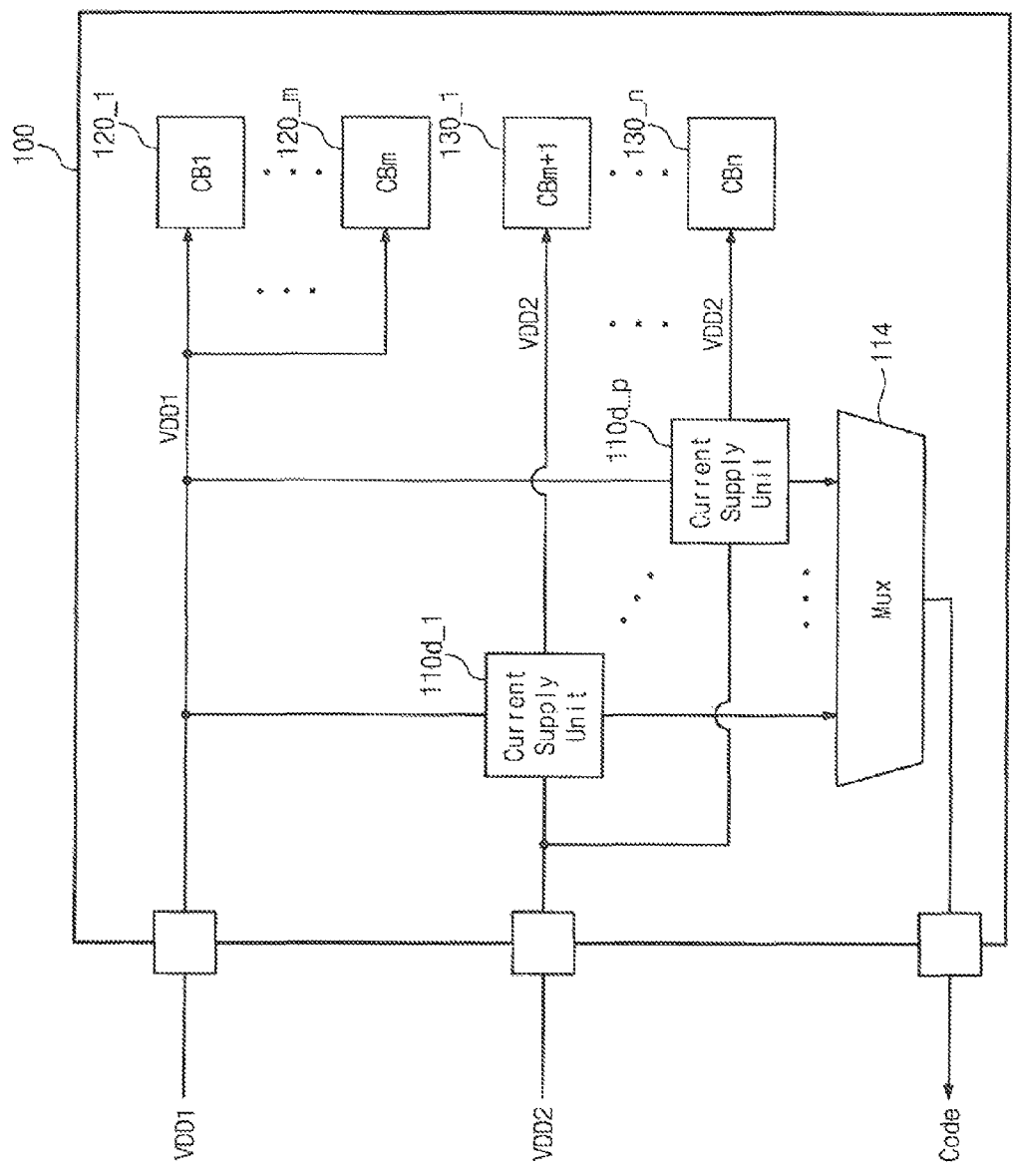
FIG. 9 illustrates a semiconductor chip including a plurality of current supply units in accordance with some embodiments of the inventive concepts.

FIG. 9 illustrates a semiconductor chip 100 including a plurality of current supply units in accordance with some embodiments of the inventive concepts. Referring to FIG. 9, the semiconductor chip 100 may include a plurality of current supply units (110d_1~110d_p, where p is an integer), a multiplexer 114, and a plurality of circuit blocks (120_1~120_m, 130_1~130_n, where n and m are integers). The semiconductor chip 100 may include the plurality of current supply units (110d_1~110d_p) corresponding to an arrangement structure of the circuit blocks (120_1~120_m, 130_1~130_n).

The first power supply voltage VDD1 may be a power supply for operating the first circuit blocks (120_1~120_m). The second power supply voltage VDD2 may be a power supply for operating the second circuit blocks (130_1~130_n). In some embodiments, the first power supply voltage VDD1 may have the same amplitude as the second power supply voltage VDD2. In other embodiments, the first power supply voltage VDD1 may also have different amplitude from the second power supply voltage VDD2. For example, in some embodiments the first power supply voltage VDD1 may be greater than the second power supply voltage VDD2. In other embodiments, the first power supply voltage VDD1 may be smaller than the second power supply voltage VDD2.

When the semiconductor chip 100 operates, the current supply units (110d_1~110d_p) may supply the second power supply voltage VDD2 to the second circuit blocks (130_1~130_n). If a supply of the second power supply voltage VDD2 is stopped, the current supply units (110d_1~110d_p) may alternatively supply the first power supply voltage VDD1 to the second circuit blocks (130_1~130_n) instead of the second power supply voltage VDD2. Thus, the current supply units (110d_1~110d_p) may supply an alternative power supply without an additional supplemental power supply device.

The current supply units (110d_1~110d_p) may be connected in one-to-one correspondence to the second circuit blocks (130_1~130_n). However, the inventive concepts are not limited thereto. In some embodiments, at least one of the second circuit blocks 130_1~130_n may be connected to each of the current supply units (110d_1~110d_p). The multiplexer 114 may receive information data about the amount of current consumed in the second circuit blocks (130_1~130_n) from the current supply units (110d_1~110d_p) to output the received information data.

Figure 10:
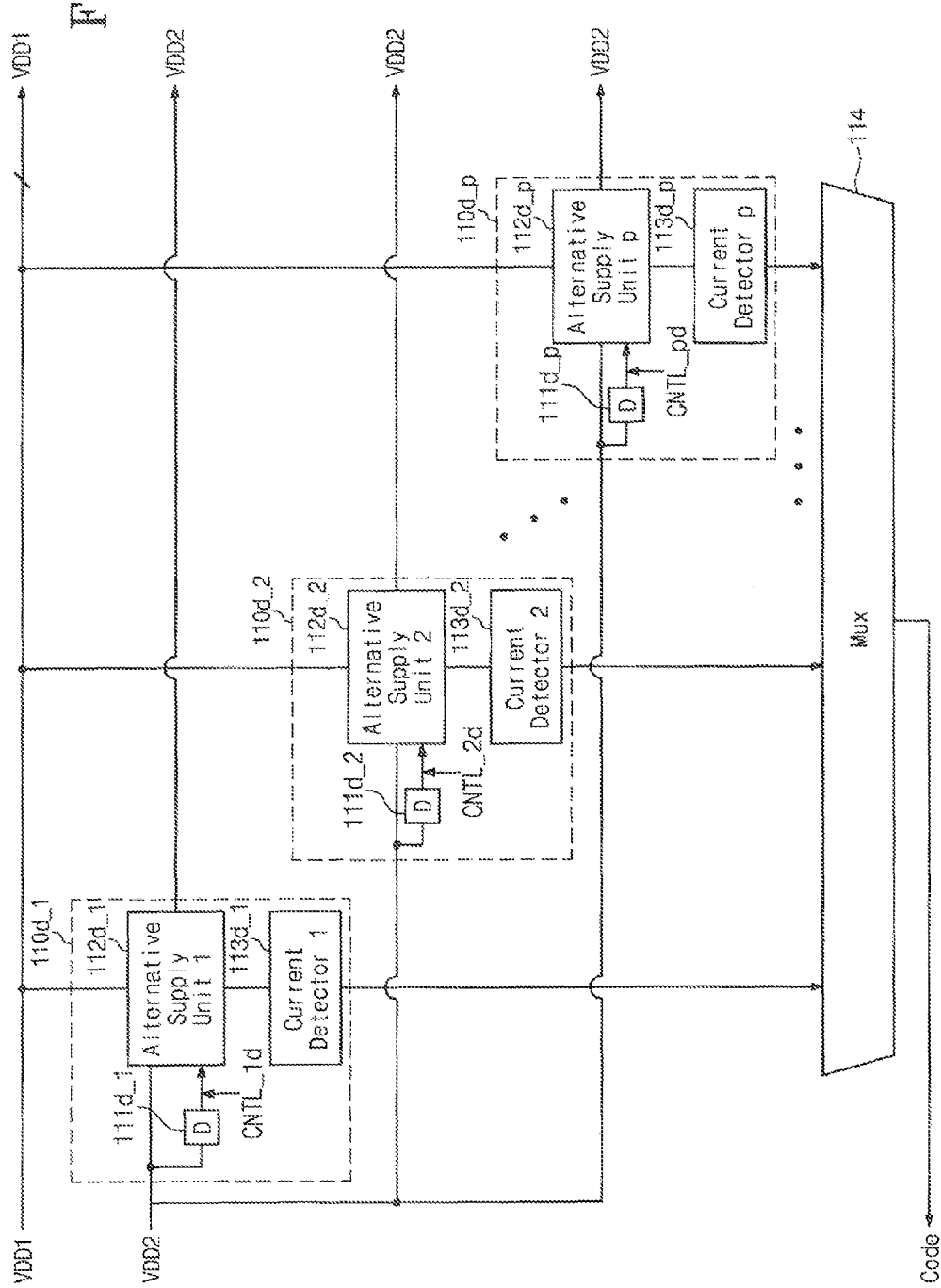
FIG. 10 is a circuit diagram illustrating a power supply in accordance with the embodiment of FIG. 9.

FIG. 10 is a circuit diagram illustrating a power supply in accordance with the embodiment of FIG. 9. Referring to FIGS. 9 and 10, when the plurality of circuit blocks (120_1~120_m, 130_1~130_n) are included in the semiconductor chip 100, the semiconductor chip 100 may include the current supply units (110d_1~110d_p). The first current supply unit 110d_1 may include a first detector 111d_1, a first alternative supply unit 112d_1 and a first current detect unit 113d_1. Each of the remaining current supply units (110d_2~110d_p) may include a similar structure as the first current supply unit 110d_1. First through pth alternative supply units (112d_1~112d_p) may include a structure as illustrated in FIG. 5.

If the plurality of detectors 111d_1~111d_p detect that a supply of the second power supply voltage VDD2 from the outside is stopped, and/or detect that a supply of the second power supply voltage VDD2 to some circuits of the semiconductor chip 100 is stopped, the detectors 111d_1~111d_p output control signals (CNTL_1d~CNTL_pd) that activate the alternative supply units (112d_1~112d_p). The control signals (CNTL_1d~CNTL_pd) may be sequentially or simultaneously output. If the alternative supply units (112d_1~112d_p) are activated by the control signals (CNTL_1d~CNTL_pd), the first power supply voltage VDD1 may be supplied to the second circuit blocks 130_1~130_n (FIG. 9) instead of the second power supply voltage VDD2. A plurality of current detect units (113d_1~113d_p) may detect the amount of current of the second circuit blocks 130_1~130_n and output information data about the detected amount of current to the multiplexer 114. If the amount of current consumed in some of the second circuit blocks 130_1~130_n is detected, the control signals (CNTL_1d~CNTL_pd) may be selectively output.

The multiplexer 114 may selectively transmit information data received from the current detect units (113d_1~113d_p) to the outside.

Figure 11:
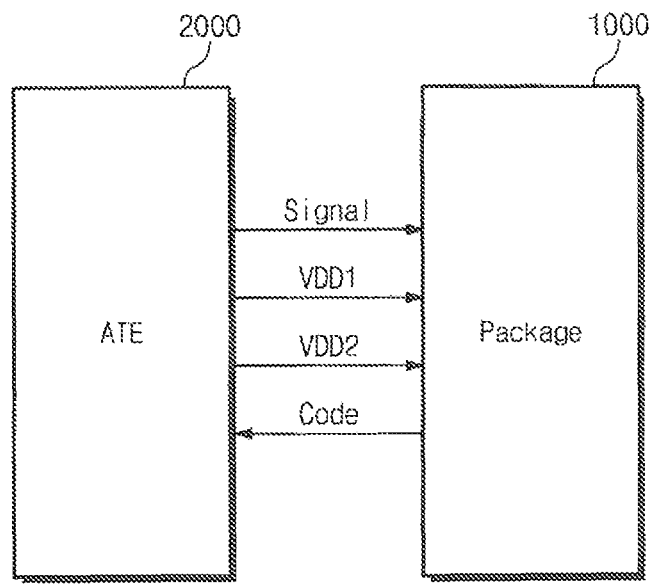
FIG. 11 illustrates a test device and a semiconductor package in accordance with some embodiments of the inventive concepts.

FIG. 11 illustrates a test device (e.g. an automated test equipment 2000) and a semiconductor package 1000 in accordance with some embodiments of the inventive concepts. Referring to FIGS. 1 and 11, the semiconductor package 1000 including the semiconductor chips 100 may be tested by the automatic test equipment (ATE) 2000. The semiconductor package 1000 may be provided with the first power supply voltage VDD1 and the second power supply voltage VDD2 from the ATE 2000. The ATE 2000 may stop a supply of one of the first power supply voltage VDD1 and the second power supply voltage VDD2 to check the amount of current consumed in each of the semiconductor chips 100 included in the semiconductor package 1000. For example, in the discussion below it is assumed that a supply of the second power supply voltage VDD2 is stopped.

Referring to FIGS. 1, 2 and 11, the ATE 2000 may provide a signal that activates the current supply unit 110a. The signal may be a MRS (mode register set) signal. Referring to FIGS. 5 and 11, in a test operation, the alternative supply unit 112a may be activated by the MRS signal provided from the ATE 2000 instead of the first control signal CNTL1 of the detector 111a. As described with reference to FIG. 5 in detail, the current detect unit 113a may check the amount of current consumed in each of the semiconductor chips 100. A semiconductor chip 100 in which the amount of current consumed is larger than a predetermined standard is consumed may be judged to be faulty.

Figure 12:
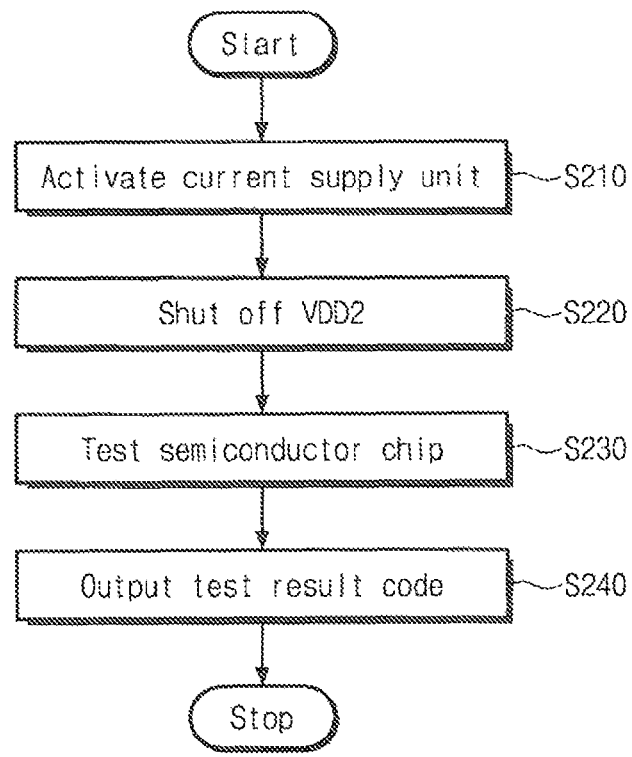
FIG. 12 is a flowchart illustrating a test method of a semiconductor package in accordance with some embodiments of the inventive concepts.

FIG. 12 is a flowchart illustrating a test method of a semiconductor package 1000 in accordance with some embodiments of the inventive concepts. Referring to FIGS. 1, 11 and 12, in a test operation, the ATE 2000 may apply a signal that activates each current supply unit 110a of the semiconductor chips 100 (S210). The ATE 2000 may shut off a supply of the second power supply voltage VDD2 (S220). Each of the semiconductor chips 100 may be tested by the first power supply voltage VDD1 (S230). Specifically, the amount of current consumed in each of the semiconductor chips 100 may be tested. Each of the semiconductor chips 100 may output a test result in a code (S240). Information data about the amount of current consumed in each of the semiconductor chips 100 may be output from the semiconductor package 1000 in the form of a code.

Figure 13:
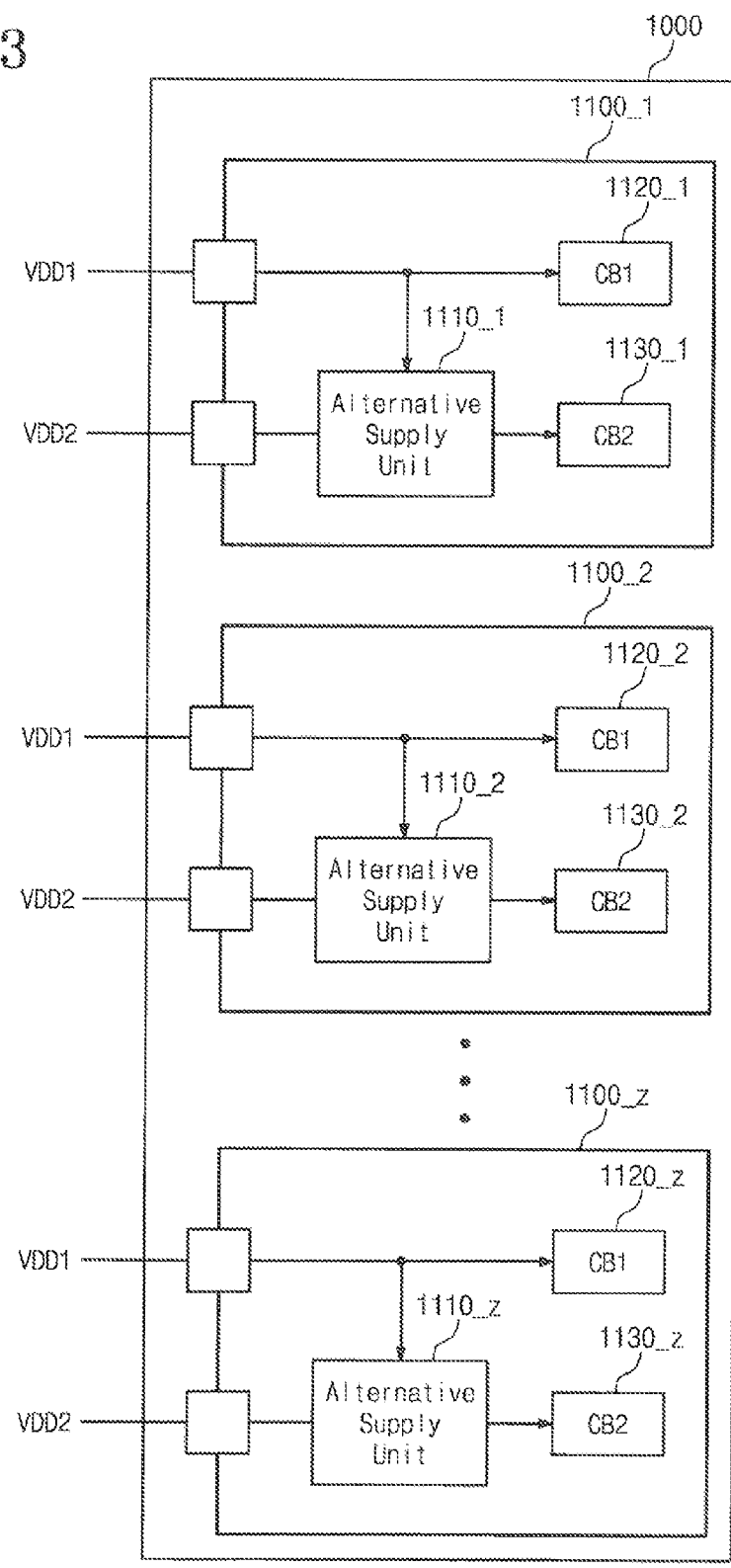
FIG. 13 is a block diagram illustrating a plurality of semiconductor chips in a semiconductor package in accordance with some embodiments of the inventive concepts.

FIG. 13 is a block diagram illustrating a plurality of semiconductor chips (1100_1~1100_z) in a semiconductor package 1000 in accordance with some embodiments of the inventive concepts. Referring to FIGS. 11 and 13, the semiconductor package 1000 may include the plurality of semiconductor chips (1100_1~1100_z). The semiconductor chips (1100_1~1100_z) may include alternative supply units (1110_1~1110_z), first circuit blocks (1120_1~1120_z) and second circuit blocks (1130_1~1130_z). Referring to FIG. 10, in some embodiments, each of the semiconductor chips (1100_1~1100_z) may include at least two circuit blocks.

The semiconductor chips (1100_1~1100_z) may be tested at the same time. The semiconductor chips (1100_1~1100_z) may also be sequentially tested. The semiconductor chips (1100_1~1100_z) may also be selectively tested. If the ATE 2000 applies a signal to only some of the semiconductor chips (1100_1~1100_z), alternative supply units of semiconductor chips that received the signal may be activated. The semiconductor chips (1100_1~1100_z) may be selectively enabled in this manner. If a supply of the second power supply voltage VDD2 is stopped, each of the second circuit blocks of the selected semiconductor chips may be supplied with a power supply voltage through its respective alternative supply unit.

Figure 14:
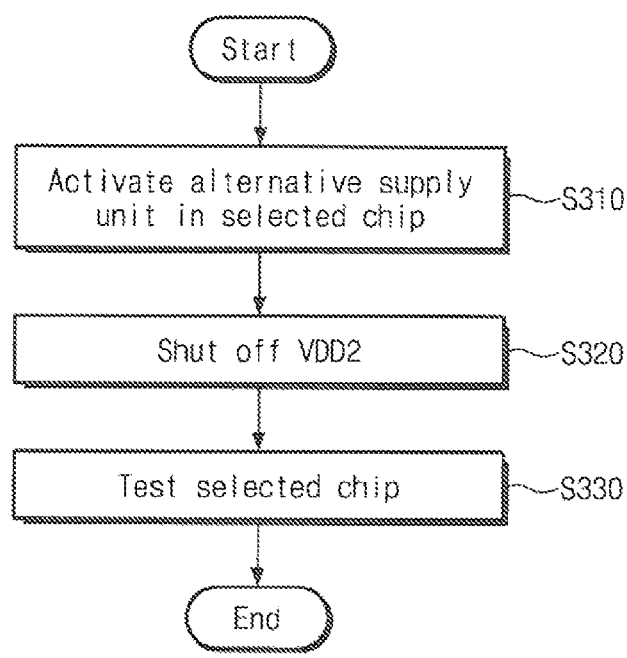
FIG. 14 is a flowchart illustrating a selective driving method of a plurality of semiconductor chips in accordance with some embodiments of the inventive concepts.

FIG. 14 is a flowchart illustrating a selective driving method of a plurality of semiconductor chips (1100_1~1100_z) in accordance with some embodiments of the inventive concepts. Referring to FIGS. 11, 13 and 14, the ATE 2000 may select semiconductor chips (1100_1~1100_z) to be operated and may output a signal to activate the selected semiconductor chips (S310). The ATE 2000 may stop a supply of the second power supply voltage VDD2 (S320). Alternative supply units of the selected semiconductor chips may be activated by the signal. The second circuit block of the selected semiconductor chips may be supplied with an alternative voltage through the alternative supply unit and may be tested (S330).

Figure 15:
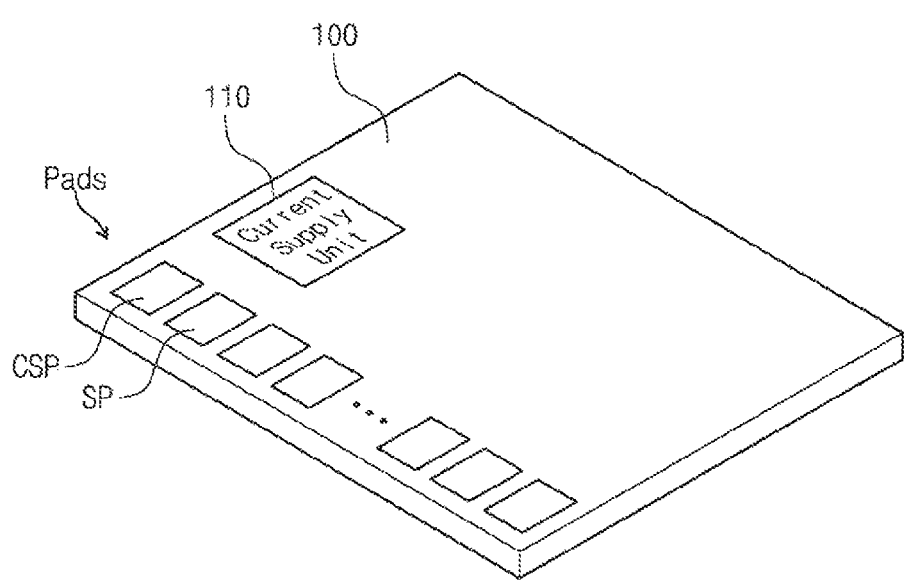
FIG. 15 illustrates a semiconductor chip in accordance with some embodiments of the inventive concepts.

FIG. 15 illustrates a semiconductor chip in accordance with some embodiments of the inventive concepts. Referring to FIG. 15, a plurality of pads may be provided on the semiconductor chip 100. The pads may be provided on a top surface of the semiconductor chip 100. The pads may be provided on a part of the top surface of the semiconductor chip 100. The semiconductor chip 100 may include a non-semiconductor chip. The non-semiconductor chip may include a memory control chip configured to control the semiconductor chip.

The semiconductor chip 100 may be a volatile semiconductor chip such as a SRAM (static RAM), a DRAM (dynamic RAM), a SDRAM (synchronous DRAM), etc. and/or a nonvolatile semiconductor chip such as a ROM (read only memory), a PROM (programmable ROM), an EPROM (electrically programmable ROM), an EEPROM (electrically erasable and programmable ROM), a flash memory, a PRAM (phase change RAM), a MRAM (magnetic RAM), a RRAM (resistive RAM), a FRAM (ferroelectric RAM), etc. The semiconductor chip 100 may be a non-memory semiconductor chip such as a LSI (large scale integrated circuit), an AP (application processor), a CPU (central processing unit), a CIS (CMOS image sensor), etc.

The semiconductor chip 100 may include signal and power supply pads SP and chip select pads CSP. The semiconductor chip 100 may receive a signal and a power supply from external to the semiconductor chip 100 and output a signal through the signal and power supply pads SP. For example, the semiconductor chip 100 may exchange a command, an address, data and various control signals through the signal and power supply pads SP.

The semiconductor chip 100 may receive chip select signals from the outside through the chip select pads CSP. For example, when a chip select signal CS has a logic high level, the semiconductor chip 100 may be selected to be activated and when a chip select signal CS has a logic low level, the semiconductor chip 100 may be selected to be inactivated.

The semiconductor chip 100 may include an embodiment of the current supply unit 110 such as those illustrated in FIGS. 1 through 9. The current supply unit 110 may include a similar structure as the current supply unit (110a, 110b or 110c) illustrated in FIGS. 2 through 4. The current supply unit 110 may supply power supply voltages supplied through the signal and power supply pads SP to internal circuits.

If a portion of the power supply voltages supplied to the semiconductor chip 100 is stopped, the current supply unit 110 may supply an alternative voltage. In a test operation of the semiconductor chip 100, the current supply unit 110 can determine the amount of current consumed in the semiconductor chip 100. As illustrated in FIGS. 9 and 10, the semiconductor chip 100 may include one or more current supply units (e.g., 110d_1~110d_p).

Figure 16:
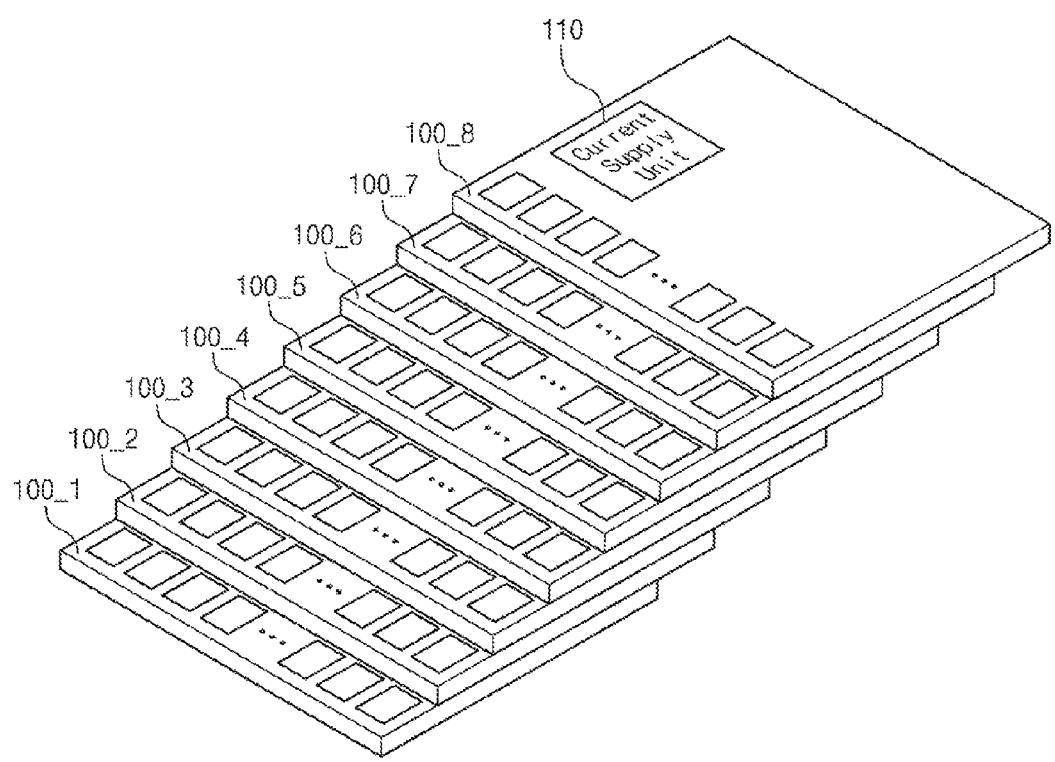
FIG. 16 illustrates a structure in which a plurality of semiconductor chips are laminated in accordance with some embodiments of the inventive concepts.

FIG. 16 illustrates a structure in which a plurality of semiconductor chips are laminated in accordance with some embodiments of the inventive concepts. Referring to FIG. 16, semiconductor chips (e.g., 100_1~100_8) may be laminated in a cascade form. Pads may be provided on a top surface of the first semiconductor chip 100_1. The second semiconductor chip 100_2 may be laminated on the first semiconductor chip 100_1. The second semiconductor chip 100_2 may expose pads of the first semiconductor chip 100_1.

Though FIG. 16 illustrates eight semiconductor chips (e.g., 100_1~100_8), the number of laminated semiconductor chips of the inventive concepts are not limited thereto. For convenience of description, it is assumed that eight semiconductor chips (100_1~100_8) are laminated. Each of the semiconductor chips (100_1~100_8) may have a similar structure as the semiconductor chips 100 described with reference to FIG. 1. Each of the semiconductor chips (100_1~100_8) may include a current supply unit 110. Each of the semiconductor chips (100_1~100_8) may include the current supply units (110d_1~110d_p) as illustrated in FIGS. 8 and 9.

If a supply of one of the first power supply voltage VDD1 and the second power supply voltage VDD2 is stopped, operations of the semiconductor chips (100_1~100_8) may be stopped. Thus, referring to FIGS. 2, 3, 4 and 14, the power supply voltage of which a supply is stopped may be replaced by the current supply unit 110 to normally operate the semiconductor chips (100_1~100_8). Only a subset of the semiconductor chips (100_1~100_8) may be enabled by supplying a selective activation signal to each of the semiconductor chips (100_1~100_8).

The current supply unit 110 may provide data about the amount of current consumed in each of the semiconductor chips (100_1~100_8) and thereby a power supply voltage applied to the semiconductor chips (100_1~100_8) may be differentially controlled.

Figure 17:
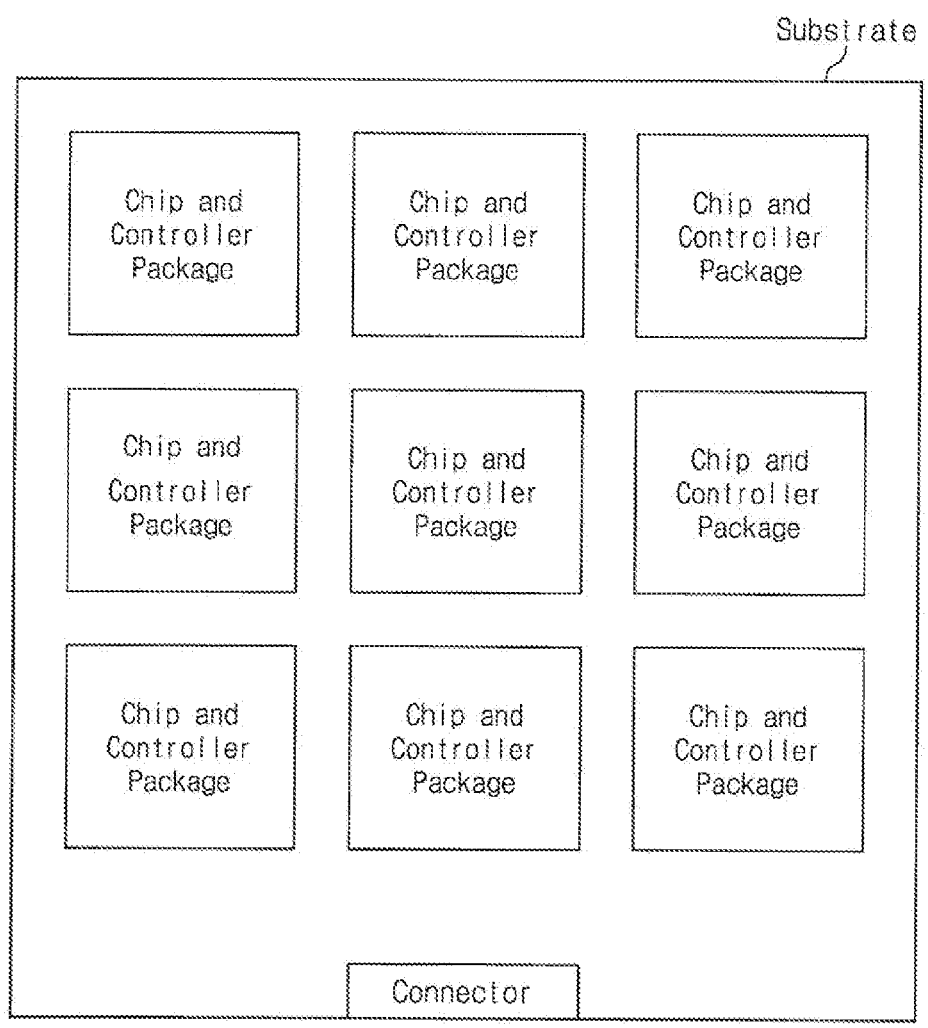
FIG. 17 illustrates a memory card in accordance with some embodiments of the inventive concepts.

FIG. 17 illustrates a memory card in accordance with some embodiments of the inventive concepts. Referring to FIG. 17, the memory card may include a substrate, a plurality of chip and controller packages, and/or a connector.

The chip and controller packages may include semiconductor chips and a control chip. The control chip may select the semiconductor chips respectively using fewer signals than the number of the semiconductor chips. Each of the chip and controller packages may include the semiconductor chips and the control chip described with reference to FIGS. 1 through 10. Each of the chip and controller packages can communicate externally through the connector.

Figure 18:
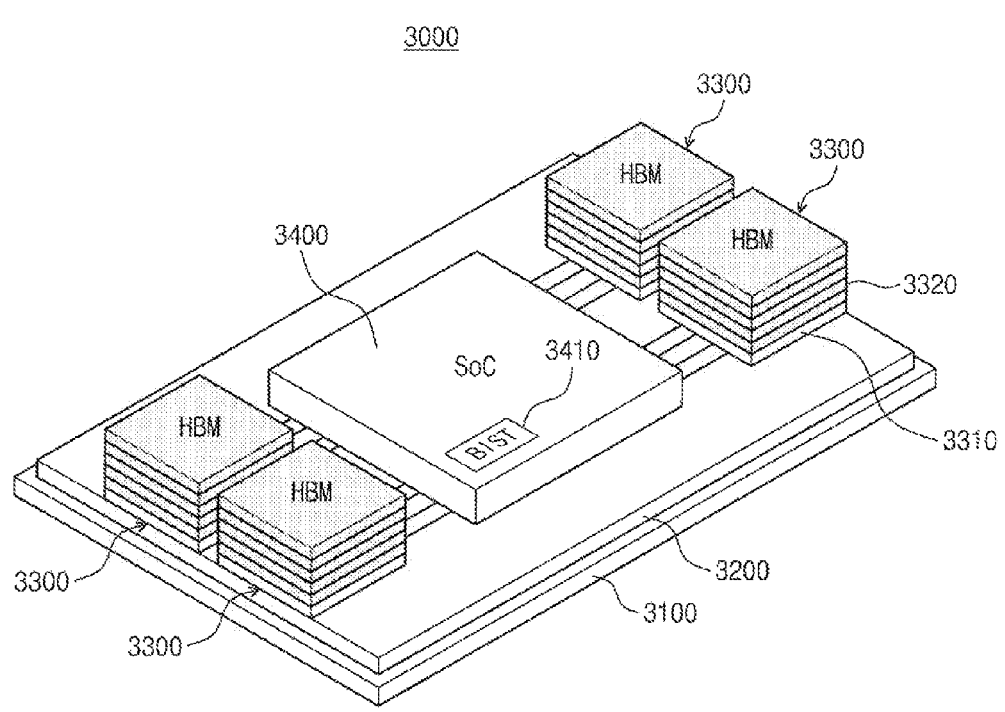
FIG. 18 illustrates a semiconductor package including a stack semiconductor chip in accordance with some embodiments of the inventive concepts.

FIG. 18 illustrates a semiconductor package 3000 including a stack semiconductor chip 2300 in accordance with some embodiments of the inventive concepts. Referring to FIG. 18, a semiconductor device 3000 may be a memory module including at least one stack semiconductor chip 2300 and a SoC (system on chip) 2400 mounted on a package substrate 2100 like a PCB (printed circuit board). An interposer 2200 may be further provided on the package substrate 2100. The stack semiconductor chip 2300 may be formed based on a CoC (chip-on-chip) technology. The stack semiconductor chip 2300 may include at least one semiconductor chip 2320 laminated on a buffer chip 2310 like a logic chip. The buffer chip 2310 and the at least one semiconductor chip 2320 may be connected to one another by a TSV (through silicon via).

The SoC 2400 may perform a test inside the semiconductor chip 2320 through a BIST (built-in self test) chip 2410 that does not need a test equipment like an ATE (automatic test equipment). Information data about the amount of current consumed in the semiconductor chip 2320 may be provided through the BIST chip 2410. For example, as described with reference to FIGS. 12 through 14, the amount of current consumed in the semiconductor chip 2320 may be measured while shutting off a part of the power supply voltages. In the case that the amount of current consumed in the semiconductor chip 2320 is larger than a predetermined standard, a use of the corresponding semiconductor chip 2320 may be stopped.

Each of the SoC 2400 and the stack semiconductor chip 2300 may include the current supply unit 110 in accordance with some embodiments of the inventive concepts. The stack semiconductor chip 2300 may be, for example, a HBM (high bandwidth memory) of 500 GB/sec through 1 TB/sec or higher.

Embodiments illustrated in each conceptual diagram should be understood only from a conceptual point of view. For better understanding, a size, a structure, and a form of constituent elements illustrated in a conceptual diagram may be exaggerated or reduced. Some embodiments may have a different physical form from that illustrated in each conceptual diagram. Each conceptual diagram is not to limit a physical form of a constituent element.

Devices and methods are illustrated the block diagrams to help understanding of the inventive concepts. Each block may be formed by blocks of a smaller unit depending on its function. A plurality of blocks may form a block of a larger unit depending on its function. The scope and spirit of the inventive concepts are not limited to the embodiments illustrated in the block diagrams.

According to some embodiments of the inventive concepts, if a part of the power being supplied to a semiconductor chip is stopped, the semiconductor chip can replace the stopped power with another power source. Thus, a semiconductor chip having improved reliability and a semiconductor package including the semiconductor chip are provided.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope of the inventive concepts are to be determined by the broadest permissible interpretation of the following claims and their equivalents, and shall not be restricted or limited by the foregoing detailed description.

What is claimed is:

1. A semiconductor chip comprising:
a first circuit block configured to receive a first power supply voltage through a first power supply terminal of the semiconductor chip;
a second circuit block configured to receive a second power supply voltage through a second power supply terminal of the semiconductor chip;
an alternative supply circuit that is connected to the first power supply terminal and to the first circuit block and configured to receive the first power supply voltage through the first power supply terminal;
a current detect circuit that is connected to the alternative supply circuit and configured to detect an amount of current consumed in the semiconductor chip; and
an output unit configured to output the detected amount of current as a data signal,
wherein the alternative supply circuit is configured to apply an alternative power supply voltage generated using the second power supply voltage to the first circuit block and the second circuit block in response to the first power supply voltage being stopped, and
wherein the alternative supply circuit comprises:
a first switch configured to be controlled by a first control signal, a first terminal of the first switch being configured to receive the second power supply voltage;
a first transistor connected between a second terminal of the first switch and a first output node;
a first comparator that is connected to a first gate terminal of the first transistor and forms a first feedback loop together with the first output node;
a second switch configured to be controlled by a second control signal, a first terminal of the second switch being configured to receive the first power supply voltage;
a second transistor connected between a second terminal of the second switch and a second output node of the semiconductor chip; and
a second comparator that is connected to a second gate terminal of the second transistor and forms a second feedback loop together with the second output node.

2. A semiconductor chip comprising:
a first circuit block configured to receive a first power supply voltage through a first power supply terminal of the semiconductor chip;
a second circuit block configured to receive a second power supply voltage through a second power supply terminal of the semiconductor chip; and
an alternative supply circuit that is connected to the first power supply terminal and to the first circuit block and configured to receive the first power supply voltage through the first power supply terminal,
wherein the alternative supply circuit is configured to apply an alternative power supply voltage generated using the second power supply voltage to the first circuit block and the second circuit block in response to the first power supply voltage being stopped, and
wherein the alternative supply circuit comprises:
a switch comprising a first terminal configured to receive the second power supply voltage and a second terminal;
a transistor connected the second terminal of the switch and to an output node of the semiconductor chip; and
a comparator comprising an output connected to a gate terminal of the transistor and an input connected to the output node to form a feedback loop together with the output node.

3. The semiconductor chip of claim 2, further comprising a detector,
wherein the detector is configured to apply a control signal to the alternative supply circuit in response to the first power supply voltage being stopped.

4. The semiconductor chip of claim 3, wherein the switch is controlled by the control signal.

5. The semiconductor chip of claim 4, further comprising a current detect circuit that is connected to the alternative supply circuit, wherein the current detect circuit is configured to detect an amount of current consumed in the semiconductor chip and to output the detected amount of current as a data signal.

6. The semiconductor chip of claim 5, further comprising an output circuit that is connected to the current detect circuit and that is configured to output the data signal.

7. The semiconductor chip of claim 1, in combination with
a second semiconductor chip,
wherein the second semiconductor chip comprises:
a third circuit block configured to receive the first power supply voltage through a third power supply terminal of the second semiconductor chip;
a fourth circuit block configured to receive the second power supply voltage through a fourth power supply terminal of the second semiconductor chip; and
a second alternative supply circuit that is connected between the third power supply terminal and the third circuit block, and configured to receive the first power supply voltage through the third power supply terminal,
wherein the second alternative supply circuit is configured to apply the alternative power supply voltage generated using the second power supply voltage to the third circuit block in response to the first power supply voltage being stopped.

8. The semiconductor chip of claim 7,
wherein the second alternative supply circuit comprises:
a third switch, a first terminal of the third switch being configured to receive the second power supply voltage;
a third transistor connected between a second terminal of the third switch and a third output node of the second semiconductor chip; and
a third comparator that is connected to a third gate terminal of the third transistor and forms a third feedback loop together with the third output node.

9. The semiconductor chip of claim 8, wherein in a test operation of the semiconductor chip and the second semiconductor chip, the semiconductor chip and the second semiconductor chip are configured to receive a control signal that turns on the first switch and the third switch respectively from an external test device.

10. The semiconductor chip of claim 9, wherein the control signal is selectively applied to the semiconductor chip or the second semiconductor chip, and one of the alternative supply circuit and the second alternative supply circuit is enabled in response to the control signal.

11. The semiconductor chip of claim 7, wherein the semiconductor chip comprises a detector configured to enable the alternative supply circuit in response to the first power supply voltage being stopped.

12. The semiconductor chip of claim 7, wherein the semiconductor chip and the second semiconductor chip are high bandwidth memory (HBMs).

13. A semiconductor chip comprising:
a first input configured to receive a first voltage supply;
a second input configured to receive a second voltage supply;
a circuit block configured to receive the first voltage supply; and
a current supply unit comprising:
a detector configured to monitor the first voltage supply and determine that the first voltage supply is stopped;
an alternative supply circuit configured to provide the second voltage supply to the circuit block responsive to a determination by the detector that the first voltage supply is stopped; and
a current detect circuit connected to the alternative supply circuit,
wherein the current detect circuit is configured to measure an amount of current consumed by the circuit block when connected to the second voltage supply, and
wherein the current detect circuit is configured to transmit the measured amount of current consumed by the circuit block as an output of the current supply unit.

14. The semiconductor chip of claim 13, wherein the alternative supply circuit comprises:
a switch connected to the second voltage supply and controlled by a control signal;
a transistor with a first terminal connected to the switch, a second terminal connected to an output node of the alternative supply circuit, and a gate terminal; and
a feedback loop connected to the gate terminal and comprising a comparator with a first input connected to a reference voltage and a second input connected to the output node of the alternative supply circuit.

15. The semiconductor chip of claim 14, wherein the control signal is generated by the detector responsive to the determination that the first voltage supply is stopped.

16. The semiconductor chip of claim 14, wherein the control signal is provided to the alternative supply circuit from a source external to the semiconductor chip via a third input to the semiconductor chip.

17. The semiconductor chip of claim 16,
wherein the current supply unit is a first current supply unit of a plurality of current supply units,
wherein the circuit block is a first circuit block of a plurality of circuit blocks, respective ones of which are connected to respective ones of the plurality of current supply units,
wherein the current detect circuit is a first current detect circuit of a plurality of current detect circuits, respective ones of which are connected to respective ones of the plurality of current supply units,
wherein respective ones of the plurality of current supply units are configured to receive the control signal to selectively provide the second voltage supply to a respective circuit block and to selectively output the amount of current consumed by the respective circuit block measured by the respective current detect circuit.

* * * * *